Dec. 13, 1966 A. K. RAPP 3,292,008

SWITCHING CIRCUIT HAVING LOW STANDBY POWER DISSIPATION

Filed Dec. 3, 1963

INVENTOR.
ADOLPH K. RAPP
BY John V. Regan
ATTORNEY

United States Patent Office 3,292,008
Patented Dec. 13, 1966

3,292,008

SWITCHING CIRCUIT HAVING LOW STANDBY POWER DISSIPATION

Adolph K. Rapp, Philadelphia, Pa., assignor to Radio Corporation of America, a corporation of Delaware Filed Dec. 3, 1963, Ser. No. 327,663
6 Claims. (Cl. 307—88.5)

Figure 1:
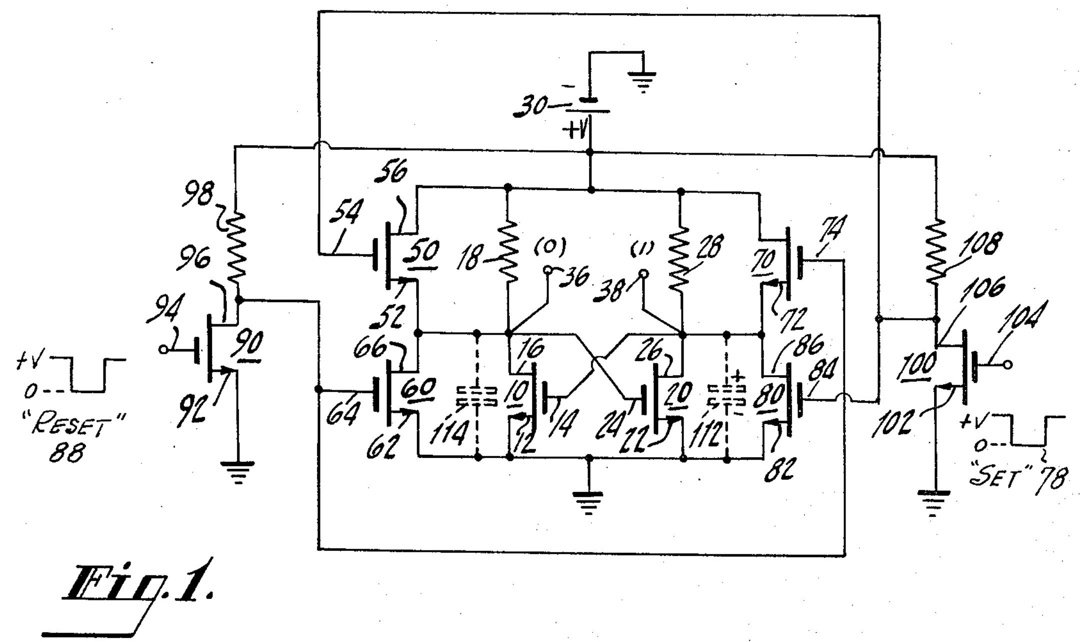

This invention relates to switching circuits and, in particular, to improved flip-flop circuitry.

A flip-flop of the so-called "Eccles-Jordan" type comprises a pair of regeneratively coupled amplifying devices. Each device has its output electrode cross-coupled to the control electrode of the other device. One amplifying device may conduct in one stable state of the circuit, and the other device conducts in the other stable state.

The steady state condition of the flip-flop may be switched by the application of an input signal having an amplitude and polarity to turn off the conducting amplifying device. The voltage at the output of that device changes in a polarity direction to turn on the previously nonconducting device. In turn, the resulting change in voltage at the output of the latter device is coupled to the control electrode of the first device and aids in the turn-off thereof. As is known, neither one of the amplifying devices changes its state of conduction instantaneously. Rather, complete switching of the flip-flop is accomplished by means of regenerative feedback over the cross-coupling paths.

The time it takes to completely switch such a flip-flop is determined in large part by the output capacitances of the circuit and by the output or load resistances through which the capacitances are charged and/or discharged. Switching speed may be increased by reducing the load resistances to provide a shorter RC constant. However, reducing the resistance increases the steady state power dissipation and heat generation because of the increase in steady state current. The value of the output resistance often is fixed by the number of other circuits driven or controlled by the flip-flop, the maximum allowable heat generated, and other factors.

It is one object of this invention to provide means for increasing the switching speed of a flip-flop without a material increase in the steady state power dissipation.

It is another object of this invention to provide an improved flip-flop in which the switching speed is largely independent of the load resistances.

It is a further object of this invention to provide an improved flip-flop wherein the load resistance is reduced during the switching transient.

These and other objects are accomplished according to the invention by providing in a flip-flop, a pair of signal controlled, variable impedance paths, each path being in shunt with the output circuitry of a different amplifying device. Signals applied to "set" the flip-flop control the impedance of one of the shunt paths, and signals applied to "reset" the flip-flop control the impedance of the other shunt path.

Figure 2:
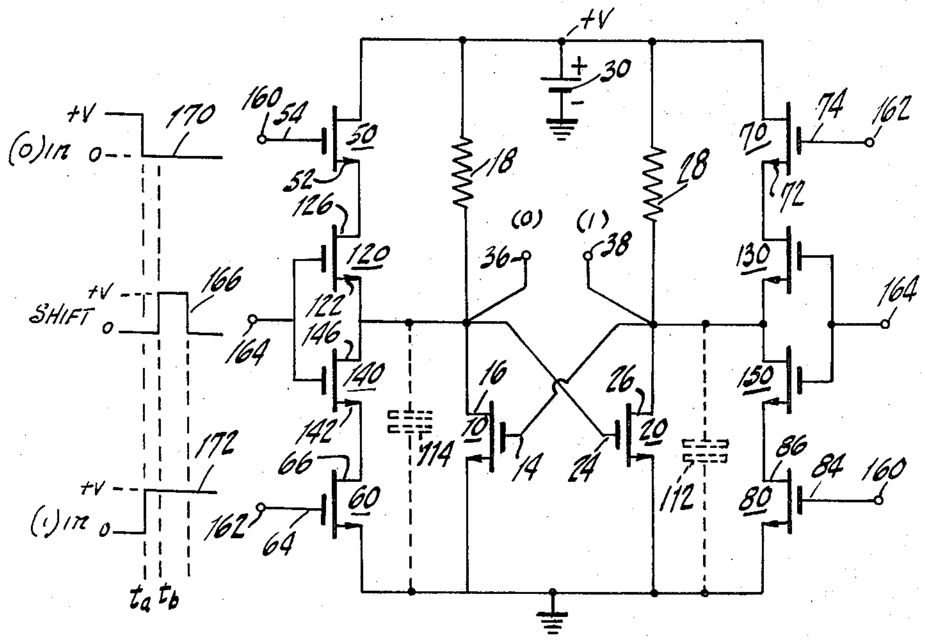

In the accompanying drawing, like reference characters denote like components, and:

FIGURE 1 is a schematic diagram of an improved set-reset flip-flop according to the invention; and FIGURE 2 is a schematic diagram of a clocked flip-flop according to the invention.

Heat generated in electrical circuits usually is undesirable because of its aging effect on circuit components, its effect in changing the operating parameters and electrical characteristics of some components, and the resulting need and expense of providing cooling means in some cases. Moreover, the heat generated represents a power loss. The problem of heat generation is especially significant in integrated and microcircuitry because of the small physical size of the circuitry and the close spacing of adjacent circuits. It is desirable, therefore, that the circuits be arranged or means be devised to reduce as much as possible the generation of heat.

An insulated-gate field-effect transistor has characteristics which make such a device particularly suitable for use in integrated circuitry. An insulated-gate field-effect transistor may be defined generally as a majority carrier field-effect device which includes a semiconductor layer or wafer to which source and drain electrodes are affixed. A gate electrode is separated by an insulated film from a portion of the semiconductor which lies between the source and drain electrodes. Since the gate is insulated from the semiconductor, it does not draw any current, or at least it draws no appreciable current. For this reason, the gate electrode of one device may be directly connected to the drain electrode of another device, and there is little or no power dissipated or heat generated in the connection.

Two types of insulated-gate field-effect transistors suitable for use in the circuits described herein are the thin-film transistor (TFT) and the metal-oxide-semiconductor (MOS). The physical and operating characteristics of a thin-film transistor are described in an article, by P. K. Weimer, entitled "The TFT–A New Thin-Film Transistor," appearing at pages 1462–1469 of the June, 1962 issue of the Proceedings of the IRE. The MOS transistor and its characteristics are described in an article entitled, "The Silicon Insulated-Gate Field-Effect Transistor," by S. R. Hofstein and F. P. Heiman, appearing at pages 1190–1202 of the September, 1963 issue of the Proceedings of the IEEE.

Suffice it to say here that an insulated-gate field-effect transistor may be of either the enhancement type or the depletion type. The enhancement type unit is of particular interest in the present application. When a device is operated in the enhancement mode, only a small leakage current flows between source and drain electrodes when the voltages at the gate and source electrodes have the same value. Current flows between source and drain when the voltage at the gate electrode is increased in a first polarity direction relative to the voltage at the source electrode.

Essentially, the conductivity of the semiconductor material in the conducting channel between source and drain electrodes is controlled by the voltage applied between the gate and source electrodes. When the semiconductor is N-type conductivity material, current flows between source and drain when the gate voltage is positive relative to the source voltage. For a P-type unit, the gate is biased negative relative to the source voltage for conduction.

Because of the desirable characteristics of such a transistor, the preferred circuits to be described are illustrated as employing insulated-gate field-effect transistors, which are especially useful therein. However, certain other amplifying devices may be used.

The FIGURE 1 flip-flop circuit comprises first and second N-type insulated-gate field-effect transistors 10, 20. First transistor 10 has its source or input electrode 12 connected to a point of reference potential, indicated by the conventional symbol for circuit ground, and has its gate, or control, electrode 14 directly connected to the drain, or output, electrode 26 of second transistor 20. Second transistor 20 has its source electrode 22 connected to ground and has its gate electrode 24 directly connected to the drain electrode 16 of first transistor 10. Resistors 18 and 28 are connected between the drain electrodes 16 and 26, respectively, and the positive terminal of a bias source, illustrated as a battery 30 having its negative terminal grounded.

The structure just described is a flip-flop of the so-called "Eccles-Jordan" type, the operation of which is well known. When first transistor 10 is conducting, the output voltage at drain electrode 16 is close to ground, and second transistor 20 is biased in a nonconducting condition by virtue of the connection between drain 16 and gate 24. The voltages at the (0) and (1) output terminals 36, 38 are approximately zero and +V volts, respectively, for this state of the flip-flop, which may be designated the "reset" state. When the flip-flop is in the "set" state, second transistor 20 conducts and first transistor 10 is biased in a cutoff condition. The (0) and (1) output voltages then are approximately +V and zero, respectively.

The input circuitry for controlling the state of the flip-flop will now be described. A third N-type transistor 50 has its source 52-drain 56 current path connected in shunt with the load resistor 18. A fourth N-type transistor 60 has its source 62-drain 66 current path connected in shunt with first transistor 10. Fifth and sixth transistors 70 and 80 are connected, in a similar manner, in shunt with the load resistor 28 and the second transistor 20. The gate electrode 54 of third transistor 50 is directly connected to the gate electrode 84 of sixth transistor 80. In like manner, the gate electrode 64 of fourth transistor 60 is directly connected to the gate electrode 74 of fifth transistor 70.

Input signals 88 for resetting the flip-flop are applied at the gate electrode 94 of a transistor 90. Transistor 90 is an N-type unit having its drain electrode 96 connected by way of a resistor 98 to the positive terminal of battery 30 and having its source electrode 92 grounded. The output voltage at the drain electrode 96 is applied directly to the gate electrodes 64 and 74 of the fourth and fifth transistors 60 and 70, respectively. Input pulses 78 for "setting" the flip-flop are applied at the gate electrode 104 of an N-type transistor 100. Transistor 100 has its drain electrode 106 connected by way of a resistor 108 to the positive terminal of battery 30 and has its source electrode 102 grounded. The output voltage at the drain electrode 106 is applied directly to the gate electrodes 54 and 84 of third and sixth transistors 50, 80, respectively.

Consider now the operation of the FIGURE 1 circuit and assume that the flip-flop is initially in the reset state. First transistor 10 is in conduction, and all of the other transistors are nonconducting. The voltage at the drain electrode 26 of second transistor 20 has a value of approximately +V volts, the value of battery 30. As is known, there is capacitance between drain electrode 26 and ground. This capacitance is represented by the dashed capacitor 112, and is made up of the capacitance of the transistor 20 itself, the capacitance of the loads connected at the output terminal 38, and the capacitance between the various leads at the output circuit of second transistor 20 and ground. When the flip-flop is in the reset condition, capacitor 112 is charged to a voltage +V in the polarity direction indicated. The output capacitance of first transistor 10 is represented by the dashed capacitor

114. This capacitor is essentially uncharged when the flip-flop is in the reset state.

The flip-flop may be switched from the reset state to the set state by applying a negaitve-going input pulse 78 at the gate electrode 104 of input transistor 100. This input pulse 78 turns off input transistor 100, and the voltage at drain electrode 106 rises close to +V volts. This output voltage is applied at the gate electrodes 54 and 84 of the third and sixth transistors 50, 80, biasing the latter transistors into conduction, whereby the transistors have a low impedance, relatively speaking, between their respective source and drain electrodes.

Consider first the manner in which the circuit would respond to the set pulse 78 if the third transistor 50 were absent from the circuit. When sixth transistor 80 is rendered conductive, the voltage at its drain electrode 86 falls close to ground potential. First transistor 10 then begins to turn off. Conducting transistor 80 furnishes a low impedance path for discharging the capacitance 112, whereby the voltage at output terminal 38 falls rapidly toward ground potential. That is to say, capacitance 112 has a very short discharge time constant.

First transistor 10 is biased into conduction when the voltage at its gate electrode 14, and the voltage at drain electrode 26 of second transistor 20, falls toward ground potential. However, the voltage at drain electrode 16, does not immediately rise in a positive direction because of the action of the capacitance 114 in the output circuit. The voltage at the drain electrode 16 can only rise in value as the capacitance 114 becomes charged, and this capacitance must charge through resistor 18 and any other load connected at the output terminal 36. In turn, second transistor 20 does not begin to conduct until the capacitance 114 charges and the voltage at drain electrode 16 rises in a positive direction, from close to ground potential.

It is thus seen that the time required to switch the flip-flop from the reset state to the set state is a function of the capacitance 114 and the resistance in the output circuit of first transistor 10. If the resistance is relatively low, the capacitance 114 charges relatively rapidly. However, the steady state power dissipation in the transistor 10 and resistor 18 is relatively high because of the high steady state current and resultingly large $I^2R$ drops. On the other hand, a relatively large resistance in the output circuit results in a longer switching time constant, but with reduced steady state power dissipation and heat generation. It is customary in prior art circuits to strike a compromise or trade-off between these two conditions.

According to the present invention, it is possible to decrease the switching time constant without a material increase in the steady state power dissipation. The manner in which this is accomplished may be seen by considering the operation of the circuit with the third transistor 50 connected in shunt with the resistor 18. Assume that the flip-flop initially is in the reset condition. A positive set pulse 78 turns off input transistor 100. The rise in voltage at the drain electrode 106 of input transistor 100 turns on the sixth transistor 80, as previously discussed, and also turns on third transistor 50. Sixth transistor 80 drives the voltage at drain electrode 26 close to ground potential and provides a low impedance path for discharging the capacitance 112, as mentioned above. First transistor 10 then is biased in a nonconducting condition. Third transistor 50 is shunted across resistor 18 and provides a low impedance path, during the switching transient, for rapidly charging the capacitance 114. This permits the resistor 18 to be chosen to have a high resistance for low steady state power dissipation and heat generation, while at the same time providing a relatively low transient impedance across resistor 18 for fast switching of the flip-flop. Essentially, third transistor 50 operates to provide a signal-controlled, variable impedance path in shunt with the resistor 18. Fifth transistor 70 likewise operates as a signal-controlled, variable impedance path in shunt with the resistor 28.

Consider now that the flip-flop is in the set state. Capacitance 114 then is charged close to +V volts and capacitance 112 is essentially uncharged. A positive reset pulse 88, applied at the gate electrode 94 of input transistor 90, raises the voltage at the drain electrode 96 thereof, and biases both the fourth and fifth transistors 60 and 70 into conduction. Fourth transistor 60 provides a low impedance path for rapidly discharging the capacitance 114, whereby the voltage at drain electrode 16 falls rapidly toward ground potential to turn off second transistor 20. Fifth transistor 70, in turn, provides a low impedance path for rapidly charging the capacitance 112 close to +V volts. First transistor 10 turns on when the voltage at drain electrode 26 rises in a positive direction, and this rise in voltage is accomplished with very little delay due to the action of fifth transistor 70.

Because of the action of third and fifth transistors 50 and 70, resistors 18 and 28 may be very high in value to limit the steady state current flowing through the respective transistors 10 and 20. This means that the power dissipated and heat generated in the steady state of the circuit may be held to a desired value. At the same time, third and fifth transistors 50 and 70 provide low impedance paths during the switching transients, whereby the flip-flop may have a fast switching time without a high steady state power dissipation.

FIGURE 2 is a schematic diagram of a flip-flop, according to the invention, which is useful as one stage of a two-phase shift register. A two-phase shift register may be defined for present purposes as one wherein the odd-numbered stages are main storage stages, and wherein the even-numbered stages are used to provide interim storage. Shift pulses of one phase are applied concurrently to the odd-numbered stages, and shift signals of a different phase are applied concurrently to the even-numbered stages.

The FIGURE 2 circuit is similar generally to the FIGURE 1 circuit, differing mainly in the addition of four N-type transistors. One of the additional transistors 120 has its source 122-drain 126 path connected in series with third transistor 50 between the drain electrode 16 of first transistor 10 and the positive terminal of battery 30. A transistor 130 is similarly connected in series with the fifth transistor 70. Another N-type transistor 140 has its source 142-drain 146 path connected in series with third transistor 60 between drain electrode 16 of first transistor 10 and circuit ground. Another transistor 150 is similarly connected in series with the sixth transistor 80 across second transistor 20.

The gate electrodes 54 and 84 of third and sixth transistors 50 and 80 are connected to a common input terminal 160. The connection is omitted in the drawing for clarity, but both electrodes are shown connected to the same numbered terminal. The gate electrodes 64 and 74 of fourth and fifth transistors 60 and 70 are both connected to a common terminal 162. The gate electrodes of the remaining input transistors 120, 130, 140 and 150 are all connected to a common input terminal 164.

When the FIGURE 2 circuit is operated as one stage of a two-phase register, input terminal 160 may be connected directly to the (0) output terminal of the flip-flop in the preceding stage, and the input terminal 162 may be connected to the (1) input terminal of the flip-flop in the preceding stage. Shift pulses 166 are applied at the common input terminal 164.

Let it be assumed that the flip-flop in FIGURE 2 is in the set state, whereby second transistor 20 is conducting and first transistor 10 is nonconducting. Let it be assumed further that the flip-flop (not shown) in the preceding stage is in the reset condition at a time $t_a$. The (0) input level 170 then is at ground potential and the (1) input level 172 is at +V volts. Transistors 120, 130, 140 and 150 in the input network are nonconducting in the absence of a shift pulse 166. Transistors 60 and 70, however, have low impedance paths between their respective source and drain electrodes because of the positive voltage applied at their gate electrodes 64 and 74.

Assume that a positive going shift pulse 166 is applied at the common input terminal 164 at a time $t_b$. This pulse 166 biases all of the transistors 120, 130, 140 and 150 in a low impedance condition. Since transistor 60 is in a low impedance condition at this time, a low impedance series path is presented in shunt with first transistor 10 between drain electrode 16 and ground. Capacitance 114 is rapidly discharged through this low impedance path, and the voltage common to drain electrode 16 of first transistor 10 and gate electrode 24 of second transistor 20 falls rapidly toward ground potential, turning off second transistor 20.

Fifth transistor 70 also is in a low impedance condition because of the high input at terminal 162. Accordingly, the transistors 70 and 130 provide a low impedance path in shunt with the resistor 28. Capacitance 112 charges rapidly through this low impedance path, and the resulting positive voltage at gate electrode 14 biases first transistor 10 into conduction.

By analogy to the above discussion, it can be shown that transistors 50 and 120 provide a low impedance path for rapidly charging the capacitance 114, and transistors 80 and 150 provide a low impedance path for discharging the capacitance 112 when the flip-flop is in the reset state, and the flip-flop (not shown) in the preceding stage is in the set state, and a shift pulse 166 is applied at input terminal 164. In FIGURE 2, the pairs of transistors 50, 120 and 70, 130 function essentially at signal-controlled, variable impedance means for rapidly charging the capacitances 114, 112, respectively, whereby the flip-flop may have a fast switching transient without a high steady state power dissipation.

Although the circuit arrangements of FIGURES 1 and 2 have been described as employing N-type transistors, it will be readily apparent to one skilled in the art that P-type devices also could be used. In the latter event, the connections to battery 30 would be reversed and the various input enabling levels and signals would have the opposite sense. In particular, the inputs might vary between zero and −V volts.

Because all of the transistors are of the same conductivity type, and because no inductors, capacitors and diodes are required, the described circuit arrangements lend themselves well to fabrication in integrated form.

What is claimed is:

1. The combination comprising:

first and second amplifying devices each having input and output electrodes defining a current carrying path, and having also a control electrode;

a direct current connection between the output electrode of each device and the control electrode of the other device;

a first impedance element having one terminal connected to the output electrode of the first amplifying device;

a second impedance element having one terminal connected to the output electrode of the second amplifying device;

means for applying operating potential, respectively, between the second terminal of each said impedance element and the input electrode of the associated amplifying device;

third and fourth amplifying devices having their current carrying paths connected, respectively, in circuit across the current carrying paths of the first and second amplifying devices;

fifth and sixth amplifying devices having their current carrying paths connected, respectively, across the first and second impedance elements;

a first signal receiving input terminal common to the control electrodes of the third and sixth amplifying devices; and a second signal receiving input terminal common to the control electrodes of the fourth and fifth amplifying devices.

2. The combination as claimed in claim 1, wherein all of said amplifying devices are insulated-gate field-effect transistors of the same conductivity type, and wherein said input, output and control electrodes are the source, drain and gate electrodes, respectively, of the field effect transistors.

3. The combination comprising:

first and second insulated-gate field-effect transistors each having a source electrode, a drain electrode and a gate electrode;

means connecting the source electrodes of the first and second transistors to a point of reference potential;

direct current conducting means cross-coupling the drain electrode of each transistor to the gate electrode of the other transistor;

a first impedance element having one terminal connected to the drain electrode of the first transistor;

a second impedance element having one terminal connected to the drain electrode of the second transistor;

means for applying operating potential between said point of reference potential and the second terminals of the first and second impedance element;

third and fourth insulated-gate field-effect transistors having their source electrodes connected to said point of reference potential and having their drain electrodes connected, respectively, to the drain electrodes of the first and second transistors;

fifth and sixth insulated-gate field-effect transistors having their source electrodes connected, respectively, to the drain electrodes of the first and second transistors, and having their drain electrodes connected to said other terminals of the first and second impedance elements;

first signal input means coupled to the gate electrodes of both the third and sixth transistors;

second signal input means coupled to the gate electrodes of both the fourth and fifth transistors; and all of said transistors being of the same conductivity type.

4. The combination comprising:

first and second junction points, the first junction point being connected to a point of reference potential;

a plurality of transistors, each transistor having input and output electrodes defining a current carrying path, and a control electrode;

a first circuit branch connected between said first and second junction points and including, in the order named, the current carrying path of a first one of said transistors and a first impedance element;

a second circuit branch connected between said first and second junction points and including, in the order named, the current carrying path of a second one of said transistors and a second impedance element;

direct current conducting means cross coupling the output electrodes of the first and second said transistors to the control electrodes of the second and first said transistors, respectively;

third, fourth, fifth and sixth ones of said transistors having their current carrying paths connected in a series chain, in the order named, between the first and second junction points;

a direct current connection between a point on said series chain, between the fourth and fifth transistors, and the output electrode of said first transistor;

seventh, eighth, ninth and tenth ones of said transistors having their current carrying paths connected in a series chain, in the order named, between said first and second junction points;

a direct current connection between the output electrode of said second transistor and a point on the last-mentioned series chain between said eighth and ninth transistors;

first signal receiving input means connected in common to the control electrodes of the fourth, fifth, eighth and ninth transistors;

second signal receiving input means connected in common to the control electrodes of the third and tenth transistors; and third signal receiving input means connected in common to the control electrodes of the sixth and seventh transistors.

5. The combination comprising:

first and second circuit points;

first, second, third, fourth, fifth and sixth transistors of one conductivity type each having input and output electrodes defining a conduction path, and a control electrode;

a first circuit branch connected between said first and second circuit points and including, in the order named, the conduction path of the first transistor and a first impedance element;

a second circuit branch connected between said first and second circuit points and including, in the order named, the conduction path of the second transistor and a second impedance element;

means cross-coupling the output electrode of the first transistor to the control electrode of the second transistor, and the output electrode of the second transistor to the control electrode of the first transistor;

additional transistors of said one conductivity type;

a first shunt circuit connected across the conduction path of the first transistor and including the conduction paths of the third transistor and one of said additional transistors;

a second shunt circuit, connected across the conduction path of the second transistor, and including the conduction paths of the fourth transistor and one of said additional transistors;

a third shunt circuit, connected across the first impedance element, and including the conduction paths of the fifth transistor and one of said additional transistors;

a fourth shunt circuit, connected across the second impedance element, and including the conduction paths of the sixth transistor and one of said additional transistors;

a first input terminal common to the control electrodes of the third and sixth transistors;

a second input terminal common to the control electrodes of the fourth and fifth transistors; and a third input terminal common to the control electrodes of said additional transistors.

6. The combination comprising:

first and second circuit points;

first and second insulated-gate field-effect transistors of one conductivity type each having a source connected to the first circuit point, and also having a drain and a gate;

direct current conducting means cross-coupling the drain of the first transistor to the gate of the second transistor, and the drain of the second transistor to the gate of the first transistor;

a first load impedance connected between the drain of the first transistor and the second circuit point;

a second load impedance connected between the drain of the second transistor and said second circuit point;

third and fourth insulated-gate field-effect transistors of said one conductivity type having their sources connected to the first circuit point and having their drains connected, respectively, to the drains of the first and second transistors;

fifth and sixth insulated-gate field-effect transistors of said one conductivity type having their sources connected, respectively, to the drains of the first and second transistors, and having their drains connected to the second circuit point;

a first signal input terminal connected in common to the gates of the third and sixth transistors; and a second input terminal connected in common to the gates of the third and fourth transistors.

References Cited by the Examiner

UNITED STATES PATENTS

| | | | |
|---|---|---|---|
| 2,874,315 | 2/1959 | Reichert | 307—88.5 |
| 2,947,949 | 8/1960 | Nakamura | 328—200 |
| 2,997,605 | 6/1961 | Portini | 307—88.5 |
| 3,114,049 | 12/1963 | Blair | 307—88.5 |
| 3,134,912 | 5/1964 | Evans | 307—88.5 |
| 3,191,061 | 6/1965 | Weimer | 307—88.5 |

OTHER REFERENCES

Solid-State Circuits Conference, Digest of Technical Papers, 2–1963, pp. 32 and 33.

Department of the Army Technical Manual—TM 11-690, Basic Theory & Application of Transistors, March 1959, p. 142.

ARTHUR GAUSS, *Primary Examiner.*

B. P. DAVIS, *Assistant Examiner.*